United States Patent
Fotouhi et al.

[11] Patent Number: 6,031,389
[45] Date of Patent: Feb. 29, 2000

[54] SLEW RATE LIMITED OUTPUT DRIVER

[75] Inventors: Bahram Fotouhi, Cupertino; Roubik Gregorian, Saratoga, both of Calif.

[73] Assignee: Exar Corporation, Fremont, Calif.

[21] Appl. No.: 08/951,618

[22] Filed: Oct. 16, 1997

[51] Int. Cl.[7] .................................................. H03K 17/16
[52] U.S. Cl. .............................. 326/31; 326/83; 326/88
[58] Field of Search ............................ 326/27, 82, 83, 326/86–88, 31, 34

[56] References Cited

U.S. PATENT DOCUMENTS

| | | | |
|---|---|---|---|
| 5,087,834 | 2/1992 | Tsay ............................................. | 326/83 |
| 5,134,311 | 7/1992 | Biber et al. ................................. | 326/82 |
| 5,488,322 | 1/1996 | Kaplinsky .................................... | 326/17 |
| 5,598,119 | 1/1997 | Thayer et al. .............................. | 326/83 |
| 5,748,019 | 5/1998 | Wong et al. ................................ | 326/83 |
| 5,777,944 | 7/1998 | Knaack et al. ............................. | 326/27 |

*Primary Examiner*—Michael Tokar
*Assistant Examiner*—Don Phu Le
*Attorney, Agent, or Firm*—Townsend and Townsend and Crew LLP

[57] ABSTRACT

A slew-rate limited output driver circuit that minimizes switching current while delivering sufficient peak load currents is disclosed. The circuit of the present invention includes fixed pull-up and pull-down transistors that are designed to dissipate minimum switching current while maintaining a predetermined slew rate. Additional pull-up and pull-down transistors are then switched in parallel to the fixed pull-up and pull-down transistors to drive the output all the way to full logic levels, after the output signal has made most of its transition. In a preferred embodiment, each switched transistor is controlled by a comparator that generates its output by comparing the level of the output signal to a predetermined reference voltage.

11 Claims, 3 Drawing Sheets

SLEW RATE LIMITED OUTPUT DRIVER

BACKGROUND OF THE INVENTION

The present invention relates in general to integrated circuits, and in particular to a slew rate limited output driver circuit that minimizes switching current while delivering sufficient peak load current.

Integrated circuits developed for applications such as data or telecommunication systems are often required to comply with certain standardized interface specifications. For example, to comply with the RS232 interface standard, an output driver circuit must be capable of driving a resistive load of about 3–7K Ohms with a voltage swing of greater than ±5 volts. The RS232 driver circuit must also be capable of driving a capacitive load of about 2500 pF at a frequency of about 20 KHz. Another requirement is a minimum of 300 Ohms of output impedance for the driver circuit under power off conditions.

In addition to the above requirements, the RS232 driver circuit must exhibit a slew rate no more than 30 volts/$\mu$sec to minimize undesirable high frequency components of the output signal that cause radiation. To meet all of these requirements places severe constraints on the design of the output driver. A conventional output driver is typically made of a CMOS inverter with a p-channel pull-up transistor and an n-channel pull-down transistor. The n-channel and p-channel transistors in the CMOS inverter are often over-designed in order to be able to supply enough current to a 3K Ohm resistive load while the output swings all the way from −5 volts to +5 volts at a maximum rate of 30 volts/$\mu$sec. The over-designing of the CMOS inverter results in large amounts of switching (or crow-bar) current.

There is therefore a need for an improved slew-rate limited output driver circuit that is capable of supplying the required peak load current while minimizing switching current.

SUMMARY OF THE INVENTION

The present invention provides a slew-rate limited output driver circuit that minimizes switching current while delivering sufficient peak load currents. Broadly, the circuit of the present invention includes fixed pull-up and pull-down transistors that are designed to dissipate minimum switching current while maintaining a predetermined slew rate. Additional pull-up and pull-down transistors are then switched in parallel to the fixed pull-up and pull-down transistors after the output signal has made most of its transition. The switched pull-up and pull-down transistors provide the necessary current boost to drive the resistive load all the way to full logic levels without impacting the overall slew rate of the output signal. In a preferred embodiment, each switched transistor is controlled by a comparator that generates its output by comparing the level of the output signal to a predetermined reference voltage.

Accordingly, in one embodiment, the present invention provides an output driver circuit having an input and an output, including a fixed pull-up transistor coupled to a fixed pull-down transistor having common gate terminals coupled to the input and common source/drain terminals coupled to the output, a switched pull-up transistor coupled in parallel to the fixed pull-up transistor, and a switched pull-down transistor coupled in parallel to the fixed pull-down transistor, wherein, the switched pull-up and pull-down transistors are selectively turned on after a signal at the output crosses a predetermined level.

In another embodiment, the present invention further includes a first comparator having a first input coupled to the output, a second input coupled to a first reference voltage, and an output coupled to a gate terminal of the switched pull-up transistor, and a second comparator having a first input coupled to the output, a second input coupled to a second reference voltage, and an output coupled to a gate terminal of the switched pull-down transistor.

In yet another embodiment, the present invention provides a method for driving an output node including the steps of: (A) pulling up toward a high power supply voltage a signal on the output node by a fixed pull-up transistor in response to an input signal; (B) pulling down toward a low power supply voltage the signal on the output node by a fixed pull-down transistor in response to the input signal; (C) comparing a level of the signal on the output node to a high reference voltage and a low reference voltage; and (D) turning on one of a switched pull-up transistor coupled in parallel to the fixed pull-up transistor or a switched pull-down transistor coupled in parallel to the fixed pull-down transistor in response to the results of the comparing step.

A better understanding of the nature and advantages of the improved output driver circuit of the present invention may be gained by reference to the detailed description and the drawings below.

DESCRIPTION OF SPECIFIC EMBODIMENTS

Figure 1:
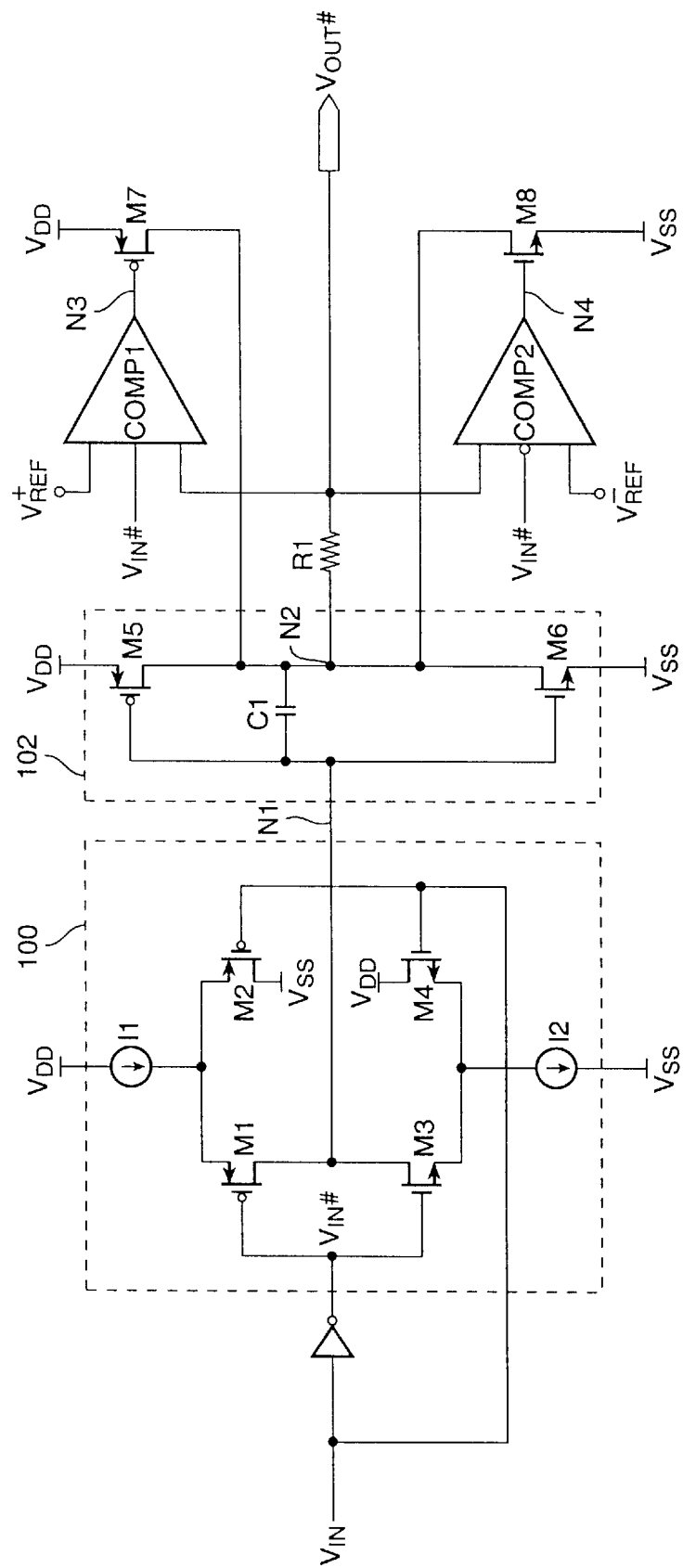
FIG. 1 is a simplified circuit diagram of the output driver circuit according to one embodiment of the present invention.

Referring to FIG. 1, there is shown a simplified circuit diagram for the output driver circuit of the present invention. The output driver circuit includes a slew rate limiting circuit 100 that receives the input signal VIN and its complement VIN#. Slew rate limiting circuit 100 includes two current source devices I1 and I2 and four transistors M1, M2, M3 and M4 connected to form two differential current steering circuits. Transistors M1, M2, M3 and M4 switch the charge-up current I1 or charge-down current I2 to node N1 in response to the input signal VIN. Node N1 connects to the input of a CMOS inverter 102 made up a p-channel pull-up transistor M5 and an n-channel pull-down transistor M6. A feedback capacitor C1 connects between input node N1 and output node N2 of inverter 102.

The magnitude of I1 and I2 together with the size of C1 are adjusted for a given output slew rate. For the RS232 interface, for example, these values can be designed to ensure that the maximum output slew rate, with minimum load capacitance, is less than the maximum allowed slew rate of about 30 V/$\mu$sec. Transistors M5 and M6 in inverter 102 are then designed to maintain the desired slew rate limiting. The present invention minimizes crow-bar current dissipated by transistors M5 and M6, by appreciably reducing the size of transistors M5 and M6. Reducing the sizes of transistors M5 and M6, however, also limits the output peak current available to the resistive load to drive the output to the appropriate RS232 logic levels. The present invention addresses this problem by switching larger output drive boosting transistors M7 and M8 that are controlled by comparators COMP1 and COMP2, respectively.

Referring back to FIG. 1, an additional p-channel pull-up transistor M7 connects in parallel to pull-up transistor M5. The output of COMP1 controls the gate terminal of transistor M7. In the pull-down path, an additional n-channel pull-down transistor M8 connects in parallel to pull-down transistor M6. The output of COMP2 controls the gate terminal of transistor M8. COMP1 receives the output signal VOUT# at one input and compares its level to a first reference voltage level VREF+ at another input. COMP1 also receives VIN# at an active high enable input. COMP2 receives output signal VOUT# at one input and compares its level to a second reference voltage level VREF− at another input. COMP2 also receives VIN# at an active low enable input.

The reduced sizing of transistors M5 and M6 does limit their drive capability, but there still is a limited output voltage range within which transistors M5 and M6 can comfortably swing between while driving the output resistive load. That is, smaller transistors M5 and M6 may not be able to drive a 3K Ohm resistive load all the way between, for example, −5 volts and +5 volts, but they can drive the output from −3 volts to +3 volts at the appropriate slew rate. The function of comparators COMP1 and COMP2 is therefore to detect when transistors M5 and M6 reach their limit, and to then activate the appropriate boost transistor to supply the extra drive required. Thus, the magnitude of reference voltages VREF+ and VREF− are set to approximately the limits of inverter 102 (e.g., VREF+≅+3 volts, and VREF−≅−3 volts). Another advantage of the circuit of the present invention is that transistors M5 and M6 operate to limit the output short circuit current (i.e., when output is shorted to ground).

Figure 2:
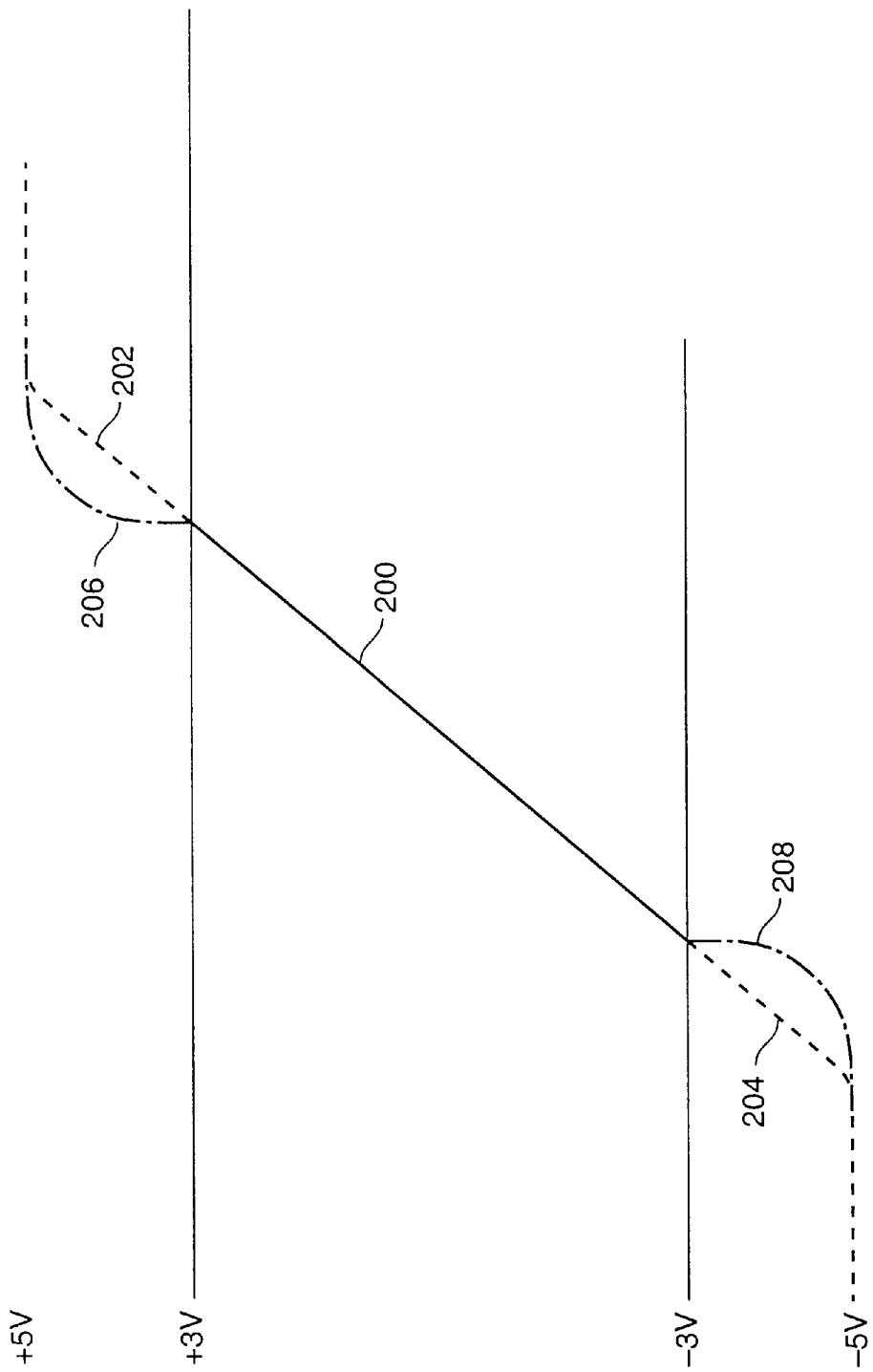
FIG. 2 depicts the waveform of the output signal illustrating the operation of the output driver circuit of the present invention.

Referring to FIG. 2, there is shown a waveform for an output signal that illustrates the operation of the circuit of the present invention. The waveform in FIG. 2 shows the rising edge of output signal VOUT#. This waveform can be divided into several segments. During the middle portion 200 of the waveform that goes from −3 volts to +3 volts, it is pull-up transistor M5 alone that is active and pulling VOUT# up to +3 volts. As VOUT# approaches +3 volts, the drain-to-source voltage Vds of transistor M5 decreases, and transistor M5 approaches the linear region of operation where it can not carry as much current. When VOUT# reaches about +3 volts, comparator COMP1 activates boost transistor M7 to supply the additional boost required. The combination of transistors M5 and M7 is responsible for pulling VOUT# all the way up to +5 volts (segment 202). On the falling edge of VOUT#, COMP1 starts turning transistor M7 off slowly as soon as VIN switches high. It is transistors M6 and M8 (under the control of COMP2) that driver VOUT# down toward −3 volts and then all the way to −5 volts in a similar fashion to the rising edge.

An important aspect of the circuit of the present invention is that it must ensure the switching of the boost transistors in parallel to the fixed transistors does not disturb the overall slew rate of the output signal. As shown in FIG. 2, abrupt switching of boost transistors may cause sharp edges at the corners of the output signal depicted by dotted lines 204 and 206. This distortion of the output signal introduces high frequency components that contribute to the radiation effect which would defeat the purpose of limiting the slew rate of the output signal.

Figure 3A:
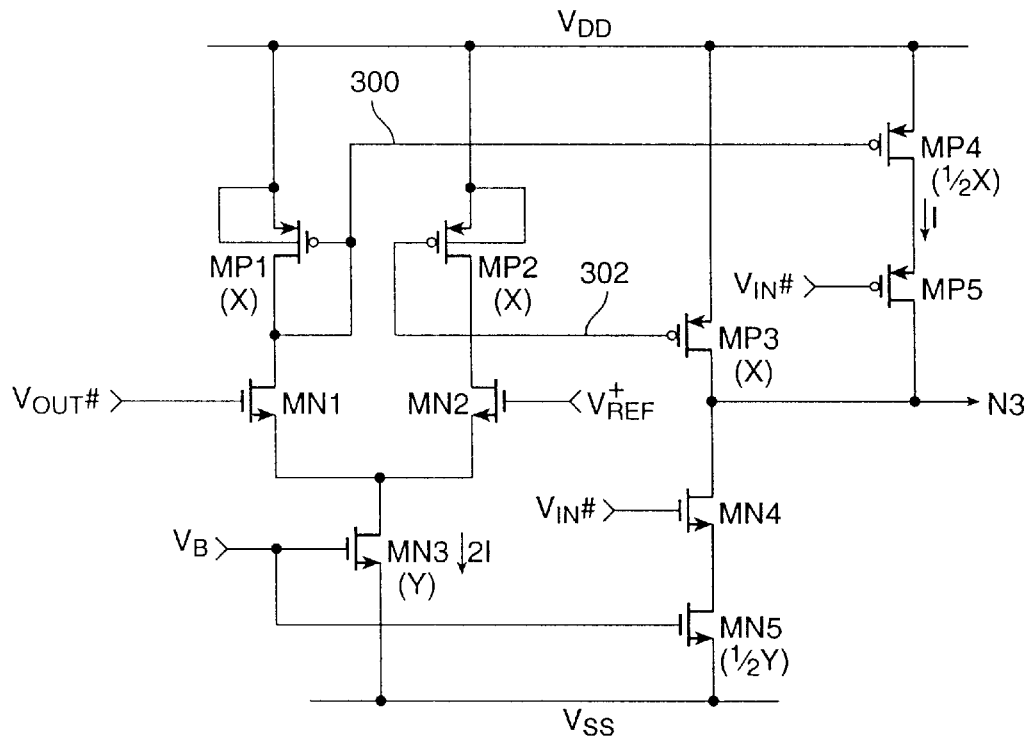
FIGS. 3A and 3B are exemplary circuit schematics according to the present invention for the output driver pull-up and pull-down comparators, respectively.
Figure 3B:
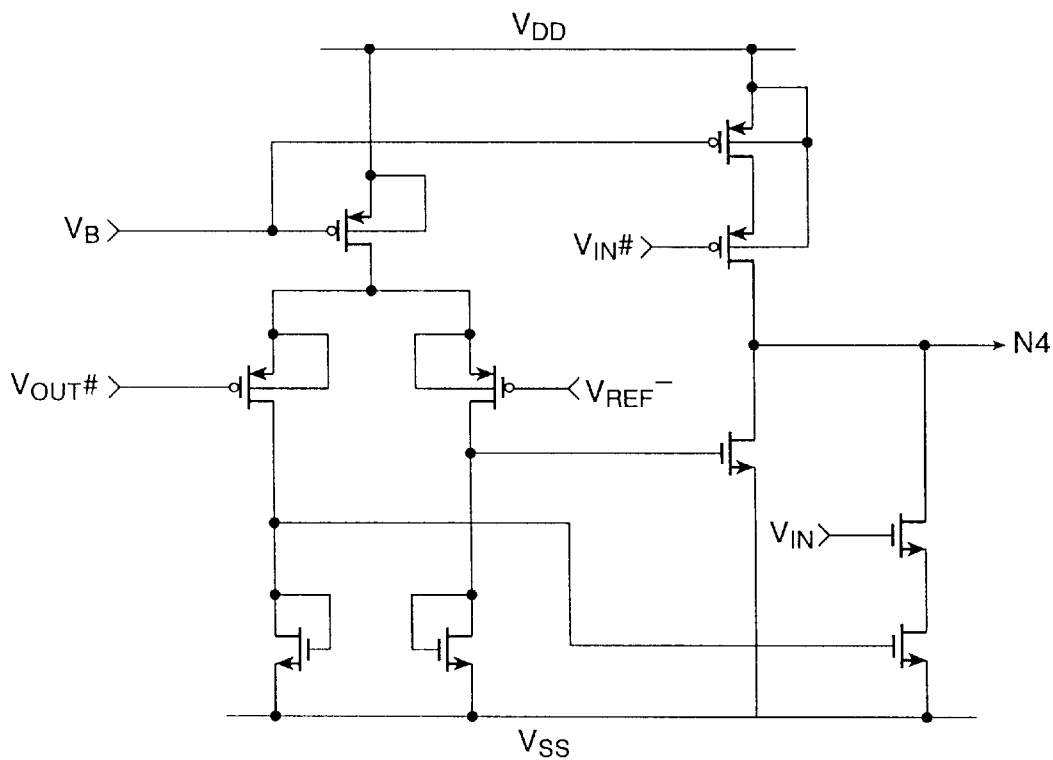

The circuit of the present invention operates to ensure smooth transitions when boost transistors are activated. This is achieved by controlling the operation of comparators COMP1 and COMP2 with slew rate limiting combination of currents I1 and I2 and capacitor C1. FIG. 3A shows an exemplary circuit implementation of comparator COMP1. COMP1 includes input transistors MN1 and MN2 that receive VOUT# and VREF+ at their gate terminals, respectively, and connect to load transistor MP1 and MP2, respectively. A current source transistors MN3 that receives a bias voltage VB at its gate, supplies a bias current (e.g., 2I=I1) for the input stage. The differential outputs of the input stage connect to gate terminals of p-channel transistors MP3 and MP4 in the output stage. Transistor MP3 directly connects to the output node N3, while transistor MP4 connects to node N3 via another p-channel transistor MP5 whose gate terminal receives signal VIN# (or a derivative of VIN# having the same logic value). The bias current for the output stage is provided by n-channel transistor MN5 whose gate connects to VB. Transistor MN5 connects to output node N3 via another n-channel transistor MN4 whose gate terminal receives signal VIN#.

The operation of this circuit will be described assuming an initial condition where VIN is low, therefore VIN# and VOUT# are high. Under this condition, because VOUT# is larger than VREF+, transistor MN1 is on and transistor MN2 is off. All of bias current 2I flows through transistors MN1 and MP1. Transistor MP3 is therefore off, while transistor MP4 is biased to be on. However, with VIN# at a high logic level, transistor MP5 is off disconnecting transistor MP4 from node N3, and transistor MN4 is on allowing transistor MN5 to pull node N3 down to a logic low level. Thus, the output of COMP1 (node N3) is low, turning on boost transistor M7 which ensures VOUT# is pulled all the way up to the full high logic level.

The input signal VIN switches much faster than the output since it is not slew rate limited. Thus, when VIN switches high, VIN# switches low turning on transistor MP5 and turning off transistor MN4. Under this condition, MP4 is connected to node N3 and MN5 is disconnected from node N3. The voltage at node N3 thus starts to move up by a current I through MP4. This current is preferably made dependent on the slew rate limiting currents I1 and I2 (FIG. 1) and is equal to, for example, one half the bias current 2I flowing through MN3 (e.g., I=½I1). Since node N3 drives the gate terminal of the large boost transistor M7, it ramps up rather slowly with a slew rate that is given by I/$C_g$, where $C_g$ is the gate capacitance of M7. As the voltage at node N3 rises slowly, transistor M7 is turned off slowly, allowing transistor M6 (in FIG. 1) to start pulling the output node VOUT# down. Once VOUT# reaches the reference level VREF+ (e.g., about +3 volts), comparator COMP1 switches state with input transistor MN1 being turned off and input transistor MN2 being turned on. All of bias current 2I flows through transistors MN2 and MP2, pulling node 302 down and turning on transistor MP3. Transistor MP3 is of the same size as transistor MP2 and therefore carries current 2I. Transistor MP3 thus pulls node N3 more quickly up toward VDD cutting off boost transistor M7. From this point on, pull-down transistor M6 takes over the function of pulling VOUT# down toward VSS with the pre-adjusted slew rate.

As VOUT# swings down toward Vss, when it reaches the lower reference voltage VREF−, comparator COMP2 is activated, pulling node N4 high and turning on boost transistor M8. Boost transistor M8 remains on until Vin switches low causing M8 to turn off slowly. In controlling boost transistor M8, COMP2 operates in a similar manner to COMP1 but with polarities reversed. Similar to COMP1, the bias voltage VB for COMP2 is designed to set a bias current for COMP2 that is, for example, one half the slew rate limiting current I2 Currents I1 and I2 are designed to provide equal positive and negative slew rates at node N2. Deriving comparator bias currents from the slew rate limiting currents can be achieved by, for example, well known current mirror circuitry. This will ensure a smooth transition at the high and low reference voltage levels.

By thus allowing smaller pull-up and pull-down transistors M5 and M6 drive the output signal for most of its swing range at the limited slew rate, the crow-bar current dissipated by the driver circuit of the present invention is significantly reduced. The additional boosting to drive the output load all the way to the required logic levels is provided by larger and stronger boost transistors that are switched on only for the final portion of the output transition. Further, by making the operation of the comparators that control the switching of the boost transistors dependent on the slew rate limiting currents, the circuit of the present invention ensures that the overall slew rate of the output signal remains substantially constant.

In conclusion, the present invention offers a slew-rate limited output driver circuit that minimizes switching current while delivering sufficient peak load currents. While the above is a complete description of the preferred embodiment of the present invention, it is possible to use various alternatives, modifications and equivalents. In particular, it is to be understood the voltage levels specified for the various power supply and reference levels are for illustrative purposes only and are not restrictive. Reference levels other than the ones used herein can be used without departing from the spirit of the invention. Therefore, the scope of the present invention should be determined not with reference to the above description but should, instead, be determined with reference to the appended claims, along with their full scope of equivalents.

What is claimed is:

1. An output driver circuit having an input and an output, comprising:
   a fixed pull-up transistor coupled to a fixed pull-down transistor, said fixed pull-up and pull-down transistors having gate terminals coupled to the input and common source/drain terminals coupled to the output;
   a charge-up current source, and a charge-down current source;
   a first current steering circuit coupled to the charge-up current source for charging up a capacitor coupled to said gate terminals of said fixed pull-up and pull-down transistors in response to a signal on the input;
   a second current steering circuit coupled to the charge-down current source for discharging said capacitor in response to said signal on the input;
   a switched pull-up transistor coupled in parallel to said fixed pull-up transistor;
   a switched pull-down transistor coupled in parallel to said fixed pull-down transistor; and
   voltage level detect circuitry coupled to said switched pull-up and switched pull-down transistors, for selectively turning on said switched pull-up or pull-down transistors after a signal at the output crosses a predetermined level.

2. The output driver circuit of claim 1 wherein said switched pull-up and pull-down transistors are larger in size than said fixed pull-up and pull-down transistors.

3. The output driver circuit of claim 2 wherein said voltage level detect circuitry comprises:
   a first comparator having a first input coupled to the output, a second input coupled to a first reference voltage, and an output coupled to a gate terminal of said switched pull-up transistor; and
   a second comparator having a first input coupled to the output, a second input coupled to a second reference voltage, and an output coupled to a gate terminal of said switched pull-down transistor.

4. The output driver circuit of claim 3 wherein said first comparator is biased by a bias current derived from said charge-up or charge-down current source, and wherein said second comparator is biased by a bias current derived from said charge-up or charge-down current source.

5. The output driver circuit of claim 4 wherein said first comparator comprises a third input coupled to a complement of the input of the output driver circuit, and wherein said second comparator comprises a third input coupled to the input of the output driver circuit.

6. The output driver circuit of claim 5 wherein said first comparator further comprises:
   a pull-up current source coupled to said output of said first comparator via a first switch transistor, a gate terminal of said first switch transistor being coupled to said complement of the input of the output driver circuit; and
   a pull-down current source coupled to said output of said first comparator via a second switch transistor, a gate terminal of said second switch transistor being coupled to said complement of the input of the output driver circuit.

7. The output driver circuit of claim 6 wherein said second comparator further comprises:
   a pull-up current source coupled to said output of said second comparator via a third switch transistor, a gate terminal of said third switch transistor being coupled to the input of the output driver circuit; and
   a pull-down current source coupled to said output of said second comparator via a fourth switch transistor, a gate terminal of said fourth switch transistor being coupled to the input of the output driver circuit.

8. An output driver circuit having an input and an output, comprising:
   a fixed pull-up transistor coupled to a fixed pull-down transistor, said fixed pull-up and pull-down transistors having gate terminals coupled to the input and common source/drain terminals coupled to the output;
   a charge-up current source, and a charge-down current source;
   a first current steering circuit coupled to the charge-up current source for charging up a capacitor coupled to said gate terminals of said fixed pull-up and pull-down transistors in response to a signal on the input; and
   a second current steering circuit coupled to the charge-down current source for discharging said capacitor in response to said signal on the input;
   a switched pull-up transistor coupled in parallel to and larger in size than said fixed pull-up transistor;
   a switched pull-down transistor coupled in parallel to and larger in size than said fixed pull-down transistor;
   voltage level detect circuitry coupled to said switched pull-up and switched pull-down transistors, for selectively turning on said switched pull-up or pull-down transistors after a signal at the output crosses a predetermined level, wherein said voltage level detect circuitry comprises:
   a first comparator having a first input coupled to the output, a second input coupled to a first reference voltage, and an output coupled to a gate terminal of said switched pull-up transistor; and a second comparator having a first input coupled to the output, a second input coupled to a second reference voltage, and an output coupled to a gate terminal of said switched pull-down transistor.

9. An output driver circuit having an input and an output, comprising:

a fixed pull-up transistor coupled to a fixed pull-down transistor, said fixed pull-up and pull-down transistors having gate terminals coupled to the input and common source/drain terminals coupled to the output;

a switched pull-up transistor coupled in parallel to said fixed pull-up transistor;

a switched pull-down transistor coupled in parallel to said fixed pull-down transistor;

a slew rate limiting circuit coupled to said fixed pull-up and pull-down transistors and configured to control an amount of slewing current supplied to said fixed pull-up and pull-down transistors;

a first comparator having a first input coupled to the output, a second input coupled to a first reference voltage, and an output coupled to a gate terminal of said switched pull-up transistor; and a second comparator having a first input coupled to the output, a second input coupled to a second reference voltage, and an output coupled to a gate terminal of said switched pull-down transistor, wherein said first and second comparators' bias current is derived from the slewing current.

10. A method for driving an output node comprising the steps of:

(A) pulling up toward a high power supply voltage a signal on the output node by a fixed pull-up transistor in response to an input signal;

(B) pulling down toward a low power supply voltage the signal on the output node by a fixed pull-down transistor in response to the input signal;

(C) controlling a slew rate of said signal at the output node by steering a slewing current in response to the input signal;

(D) comparing a level of the signal on the output node to a high reference voltage and a low reference voltage; and (E) turning on one of a switched pull-up transistor coupled in parallel to the fixed pull-up transistor or a switched pull-down transistor coupled in parallel to the fixed pull-down transistor in response to the results of the comparing step.

11. The output driver circuit of claim 9, wherein the slew limiting circuit comprises:

a charge-up current source, and a charge-down current source;

a first current steering circuit coupled to the charge-up current source for charging up a capacitor coupled to said gate terminals of said fixed pull-up and pull-down transistors in response to a signal on the input; and a second current steering circuit coupled to the charge-down current source for discharging said capacitor in response to said signal on the input.

* * * * *